(12) United States Patent
Bronner et al.

(10) Patent No.: US 6,320,215 B1
(45) Date of Patent: Nov. 20, 2001

(54) CRYSTAL-AXIS-ALIGNED VERTICAL SIDE WALL DEVICE

(75) Inventors: Gary Bronner, Stormville; Ulrike Gruening, Wappingers Falls; Jack A. Mandelman, Stormville; Carl J. Radens, LaGrangeville, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/359,292

(22) Filed: Jul. 22, 1999

(51) Int. Cl.[7] .......................... H01L 27/108; H01L 29/76; H01L 29/94; H01L 29/04
(52) U.S. Cl. .......................... 257/301; 257/302; 257/627; 257/628
(58) Field of Search .................... 257/301, 302, 257/627, 628, 296, 300, 330; 438/243

(56) References Cited

U.S. PATENT DOCUMENTS

| | | | |
|---|---|---|---|
| 4,017,885 | * 4/1977 | Kendall et al. | 357/51 |
| 4,495,219 | 1/1985 | Kato et al. | 427/82 |
| 4,728,623 | * 3/1988 | Lu et al. | 437/52 |
| 4,971,926 | 11/1990 | Kinugawa | 437/67 |
| 5,142,438 | 8/1992 | Reinberg et al. | 361/313 |
| 5,494,840 | 2/1996 | Ohmi | 437/52 |
| 5,543,348 | 8/1996 | Hammerl et al. | 437/60 |
| 5,736,449 | 4/1998 | Miki et al. | 438/396 |
| 5,827,765 | * 10/1998 | Stengl et al. | 438/243 |
| 5,861,104 | * 1/1999 | Omid-Zohoor | 216/84 |

FOREIGN PATENT DOCUMENTS

| | | | |
|---|---|---|---|
| 42-17420 | * | 12/1992 | (DE) . |
| 61-194867 | * | 8/1986 | (JP) . |
| 63-197365 | * | 8/1988 | (JP) . |

OTHER PUBLICATIONS

01065862 Mar. 13, 1989, Japan.

* cited by examiner

*Primary Examiner*—Minh Loan Tran
(74) *Attorney, Agent, or Firm*—Ratner & Prestia

(57) ABSTRACT

A dynamic random access memory (DRAM) cell comprising a deep trench storage capacitor having an active transistor device partially disposed on a side wall of the trench. The side wall is aligned to a first crystallographic plane having a crystallographic orientation along a single crystal axis. A process for manufacturing such a DRAM cell comprises: (a) forming a deep trench in a substrate, (b) forming a faceted crystal region along the trench side wall having a single crystallographic orientation, and (c) forming a transistor device partially disposed on the faceted crystal region in the side wall. The faceted crystal region may be formed by growing an oxide collar, such as by local thermal oxidation under oxidation conditions selected to promote a higher oxidation rate along a first family of crystallographic axes than along a second family of crystallographic axes.

4 Claims, 3 Drawing Sheets

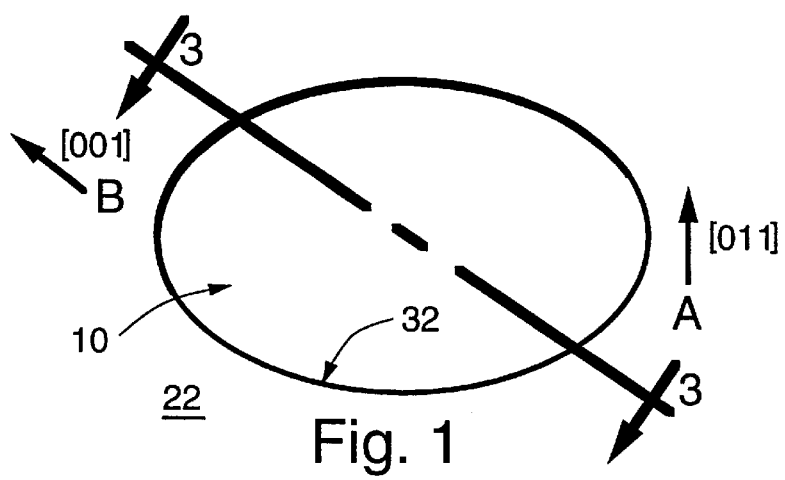
Fig. 1
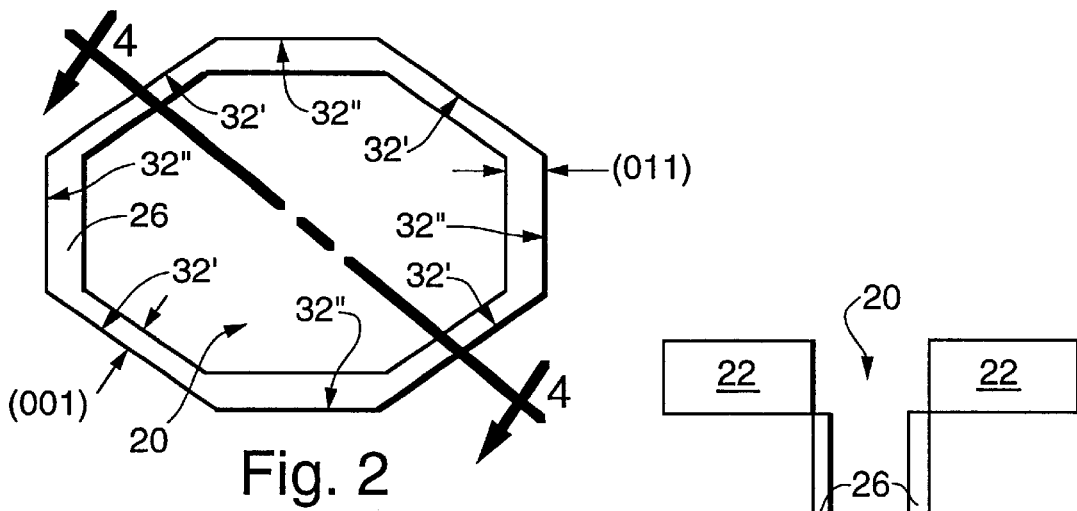
Fig. 2
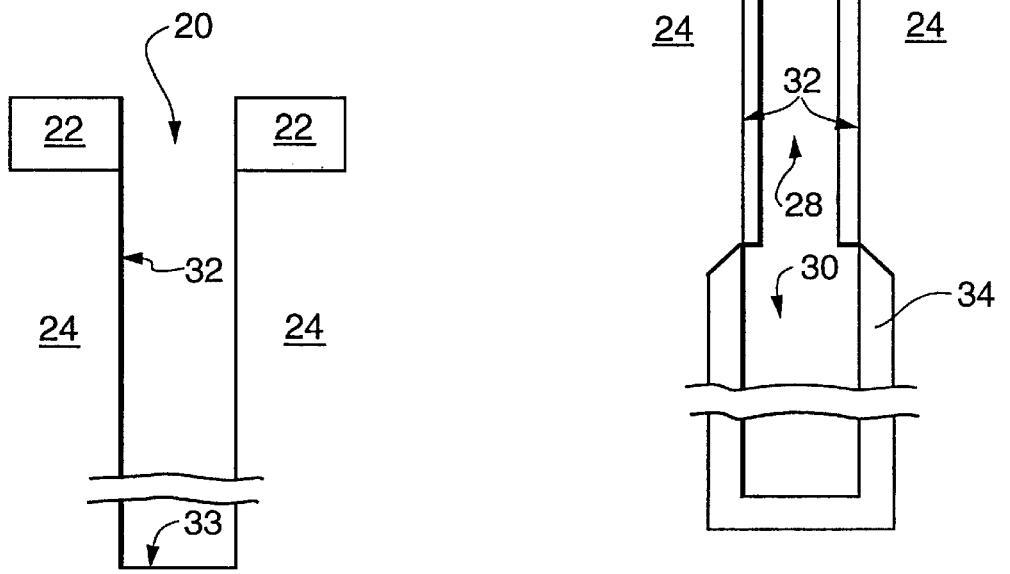
Fig. 3
Fig. 4

CRYSTAL-AXIS-ALIGNED VERTICAL SIDE WALL DEVICE

TECHNICAL FIELD

The present invention relates generally to semiconductor transistor devices and, more specifically, to DRAM cells having non-planar transistor channel regions.

BACKGROUND OF THE INVENTION

Dynamic Random Access Memory (DRAM) cells can retain information only temporarily, on the order of milliseconds, even with power continuously applied. Therefore, the cells must be read and refreshed at periodic intervals. Although the storage time may appear to be short, it is actually long enough to allow many memory operations to occur between refresh cycles. The advantages of cost per bit, device density, and flexibility of use (i.e., both read and write operations are possible) have made DRAM cells the most widely used form of semiconductor memory to date. The earliest DRAM cells were three-transistor cells. Today, DRAM cells consisting of only one transistor and one capacitor have been implemented.

As DRAM circuits are scaled to small dimensions, it becomes increasingly important to form compact array cell layouts. The active device transistor is placed along the vertical side wall of a deep-trench storage capacitor in one type of array cell layout. Such a configuration forms a non-planar transistor device.

The non-planar transistor channel region crystal orientation can be a function of lithographic-projected image shape and the overlay between lithographically defined deep trench and active area patterns. Gate oxide thickness, surface state density, and other physical and electrical properties may be a function of the projected image shape and the overlap between the deep trench and active area patterns. These physical and electrical properties influence the transistor electrical, physical, and reliability characteristics.

As shown in FIG. 1, a typical deep trench having an elliptical cross section has a vertical side wall 32 that cuts across a continuum of planes including {001} and {011} crystal planes. Side wall 32 is not aligned with any particular crystal plane. Therefore, side wall 32 has associated crystal-plane-dependent properties that vary as side wall 32 makes a curved transition from one crystallographic plane to the other.

In accordance with standard crystallographic nomenclature, various symbols have specified meanings. Among those symbols are rounded brackets, { }, which refer to families of equivalent crystallographic planes (i.e., the {001} family of planes); parentheses, ( ), which refer to specific crystallographic planes (i.e., the (100) plane); horizontal triangles, < >, which refer to families of equivalent crystallographic axes (i.e., the <011>family of axes); and square brackets, [ ], which refer to a specific crystal axis (i.e., the [110] axis). For example, in silicon crystals, the (100) plane and the (001) plane are equivalent to one another and, thus, are both in the same {001} family of planes.

For optimized device performance, it is desirable to provide a side wall device aligned to a single crystallographic plane having a crystallographic orientation along a single crystal axis. It is an object of the present invention, therefore, to provide a crystal-axis-aligned, non-planar transistor structure. A related object is to provide a process for obtaining such a structure.

SUMMARY OF THE INVENTION

To achieve these and other objects, and in view of its purposes, the present invention provides a dynamic random access memory (DRAM) cell. The cell comprises a deep trench storage capacitor having an active transistor device partially disposed on a side wall of the deep trench. The side wall is aligned to a first crystallographic plane having a crystallographic orientation along a single crystal axis. The substrate surface may be aligned along a second crystallographic plane. The first and second crystallographic planes may be in the same family of equivalent crystallographic planes, such as the {001} family, or the first and second crystallographic planes may be in different families.

The present invention also provides a process for manufacturing a DRAM cell. The process comprises: (a) forming a deep trench in a substrate, (b) forming a faceted crystal region having a single crystallographic orientation along the trench side wall, and (c) forming a transistor device partially disposed on the faceted crystal region in the side wall. The faceted crystal region may be formed by growing an oxide collar, such as by local thermal oxidation under oxidation conditions selected to promote a higher oxidation rate along a first family of crystallographic axes, such as along the <011>family of crystal axes, than along a second family of crystallographic axes, such as along the <100>family of crystal axes. Other chemical and physical mechanisms may also be used to induce faceting in the trench side wall.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice, the various features of the drawing are not to scale. On the contrary, the dimensions of the various features are arbitrarily expanded or reduced for clarity. Included in the drawing are the following figures:

FIG. 1 is a schematic illustration plan view of an exemplary deep trench structure having crystal orientations as shown;

FIG. 2 is a schematic illustration plan view of the deep trench structure of FIG. 1 after a local oxidation step, highlighting the faceted side walls of the trench according to the present invention;

FIG. 3 is a schematic, cross-sectional illustration of the trench of FIG. 1 taken along the line 3—3;

FIGS. 4 through 10 are schematic, cross-sectional, in-process illustrations of the trench of FIG. 2 taken along the line 4—4 depicting steps in an exemplary process for manufacturing an exemplary DRAM cell of the present invention, with FIG. 4 showing an isolation collar formed in the upper region of the trench and a buried plate in the lower region of the trench;

FIG. 5 shows the trench of FIG. 4 after a dielectric is applied and the trench is partly filled with polysilicon;

FIG. 6 shows the trench of FIG. 5 after the collar is etched;

FIG. 7 shows the trench of FIG. 6 after a buried strap is formed;

FIG. 8 shows the trench of FIG. 7 after the buried strap is removed from the side walls of the trench above the polysilicon and above the pad;

FIG. 9 shows the trench of FIG. 8 after a trench-top dielectric is formed, the pad is stripped, a sacrificial oxide is grown on the exposed surface of the substrate and on the exposed side wall of the trench, a p-well and an n-band are created in the substrate, and diffusion regions are formed in the substrate;

FIG. 10 shows the trench of FIG. 9 after the sacrificial oxide is removed, a gate oxide is grown, a conductive gate layer is formed, an active area is patterned, an etching step is performed to etch shallow trench isolation (STI) regions everywhere except in the active area, the STI regions are filled and planarized to the pad nitride, and the pad nitride is stripped away;

DETAILED DESCRIPTION OF THE INVENTION

Figure 5:
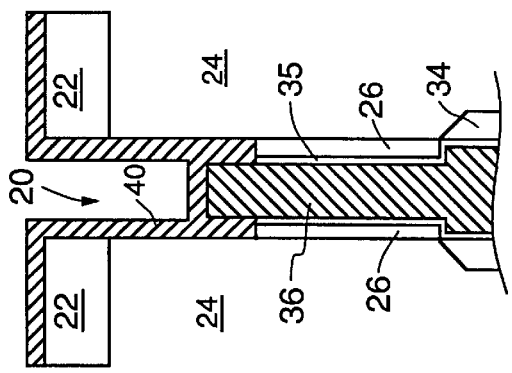

Referring now to the drawing, in which like reference numbers refer to like elements throughout, FIGS. 1–12 show various aspects of an exemplary DRAM cell of the present invention and intermediate steps in the process for making the cell. As shown in FIGS. 1 and 3, a typical deep trench storage capacitor 10 is formed into a pad 22 and a substrate 24 by conventional processing techniques well known in the art. For example, an optical lithography step may be used to form a pattern on pad 22. Then a dry etching step, such as reactive-ion etching (RIE), may be used to create a trench 20 to a desired depth through pad 22 and into substrate 24.

The cross-sectional pattern of deep trench 20 is typically an ellipse that cuts across crystal axes A and B. For example, as shown in FIG. 1, axis A may have a [011] crystallographic orientation and axis B may have a [001] orientation. Substrate 24 is typically silicon and pad 22 is typically a silicon nitride (SiN) layer having a thickness of about 10 nm to about 100 nm. There may also be a thin thermal oxide layer (not shown), typically about 3 nm to about 10 nm thick, between substrate 24 and pad 22. Deep trench 20 generally has a depth of about 3 µm to about 10 µm and a diameter or maximum width that is a function of the lithographic ground rule, typically about 0.5 µm to less than 0.1 µm. Trench 20 has side walls 32 and a bottom 33.

As shown in FIGS. 2 and 4, in accordance with the present invention, an isolation collar 26 is formed in upper region 28 of trench 20. Upper region 28 typically comprises 10 to 20% of the total depth of trench 20. Collar 26 may be formed using local thermal oxidation (LOCOS), such as by the exemplary process explained below, or by other physical and chemical mechanisms, as also indicated below.

Before the oxidation step, a barrier film (not shown) may be formed along the exposed surfaces of trench 20 and pad 22 such as by a low-pressure chemical vapor deposition (LPCVD) of a SiN film having a thickness of about 2 nm to about 10 nm. The barrier film is then removed from upper region 28, for example by filling trench 20 with photoresist (not shown) and partially etching the photoresist down into trench 20 to a depth controlled by the amount of overetch time. This step exposes the barrier film in upper region 28 while leaving the lower region 30 covered. The exposed barrier film may then be removed in upper region 28 of trench 20 and from pad layer 22, for example, by chemical or dry etching, and then the photoresist stripped away. Other processes for isolating side wall 32 in upper region 28 while protecting side wall 32 in lower region 30 may also be used.

The local oxidation step is then performed at oxidation conditions that promote the oxidation rate along one family of crystal axes over another, such as, for example, promoting oxidation along <011>axes over <001>axes. For instance, the oxidation step may comprise the use of oxygen (O2) or water (H2O) at a temperature of between about 800° C. and about 1,100° C. for between about 2 minutes and about 10 minutes, not including ramping time, to achieve an oxide isolation collar 26 having a thickness of between about 10 nm to about 50 nm. Such oxidation conditions induce faceting of the underlying silicon substrate 24 during growth of collar 26.

Thus, the curved trench wall 32 having an elliptical cross section, as shown in FIG. 1, facets into a polygonal cross section having distinct planar walls 32' and 32" aligned with crystal planes (001) and (011), respectively, as shown in FIG. 2. Faceted walls 32' and 32" thus have consistent physical and electrical properties along the faceted structure, providing improved transistor electrical, physical, and reliability characteristics as compared to transistors built on unfaceted trench walls. The thermal oxide collar 26 and associated faceting are formed only on side walls 32 in upper region 28 of trench 20; the barrier film protects side walls 32 in lower region 30 of trench 20.

Faceted side walls 32', 32" may be formed, as described above, by thermal oxidation. Faceted side walls 32', 32" may instead be formed by other physical or chemical mechanisms. Such mechanisms include, for example, preferential crystal axis etching, such as etching with potassium hydroxide (KOH), as is well-known in the art.

The remaining DRAM structure may be constructed according to processes well known in the art, such as the exemplary process described below. The process provided below is not intended to be a limitation of the present invention, but rather is included for illustration. In such an exemplary process, the barrier film in lower region 30 is stripped via a process that selectively leaves thermal oxide isolation collar 26 in upper region 28 of trench 20. Buried plate 34 is then created in lower region 30, leaving the configuration shown in FIG. 4. Buried plate 34 may be created by doping lower region 30 of trench 20 to form an out-diffusion in substrate 24 using collar 26 as a mask for upper region 28. The out-diffusion may be formed using arsenosilicate glass (ASG) drive-in, plasma doping CLAD), plasma ion implantation (PIII), gas-phase diffusion of arsenic (As) or phosphorus (P), or other techniques known in the art.

Next, as shown in FIG. 5, a thin node dielectric 35 is created, such as by thermal nitridation, for example with ammonia (NH3), followed by LPCVD of SiN. Finally, trench 20 is filled, such as with an n+ doped LPCVD polysilicon 36, and recessed to a desired depth D1. Depth D1 is typically about 300 nm to about 700 nm, preferably between 300 to 450 nm.

Figure 6:
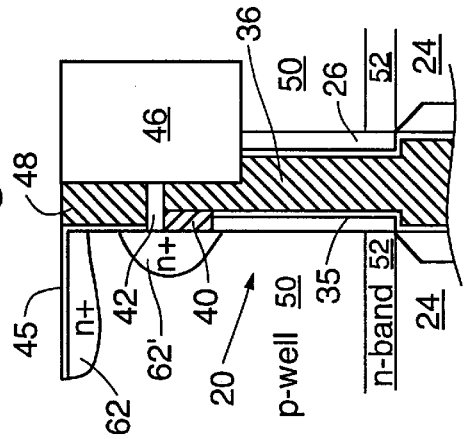

Isolation collar 26 is then etched away, such as with a wet etch using a solution containing hydrogen fluoride (HF), to expose side walls 32 in the area where the collar 26 is not covered by polysilicon 36 and below the polysilicon level to a depth D2, as shown in FIG. 6. D2 is typically about 10 nm to about 50 nm.

Figure 7:
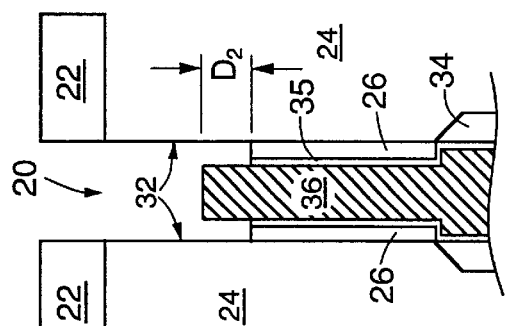
Figure 8:
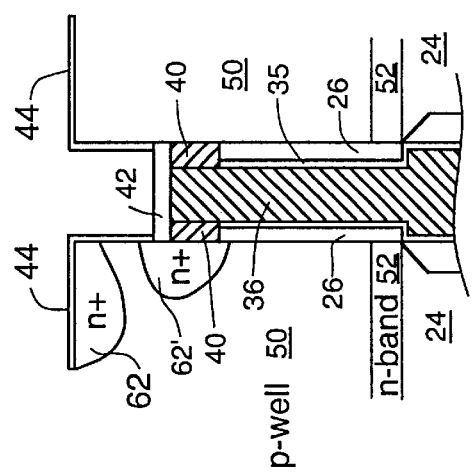

Next, as shown in FIG. 7, a buried strap 40 is formed. Typically of LPCVD silicon, buried strap 40 is formed in a layer having a thickness of about 10 nm to about 50 nm. As shown in FIG. 8, buried strap 40 is then removed from side walls 32 of trench 20 above polysilicon 36 and above pad 22, such as by an isotropic wet chemical or dry etching step.

Figure 9:
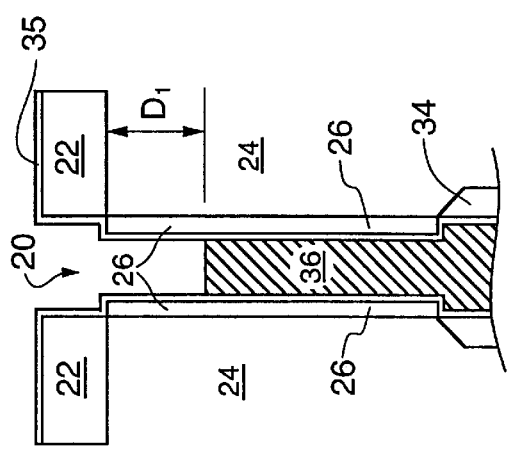

Then, as shown in FIG. 9, trench-top dielectric 42 or trench-top oxide (TTO) is formed, such as by an anisotropic high-density plasma (HDP) or other bias-assisted oxide deposition step. The creation of trench-top dielectric 42 typically forms a corresponding layer (not shown) atop pad 22, which is removed by a chemical mechanical polishing (CMP) step as is known in the art. Thus exposed, pad 22 is then stripped, typically by a wet chemical etch step selective to trench-top dielectric 42, and a sacrificial oxide 44 is grown on the exposed surface of substrate 24 and exposed side wall 32 of trench 20, as shown in FIG. 9.

Ion implantation may then be used to create a p-well 50 and an n-band 52 below p-well 50 in substrate 24. Similarly, ion implantation of As or P may be used to create diffusion region 62. Another diffusion region 62' is created by out-diffusion from n+ doped polysilicon region 36 through buried strap 40. Such process steps yield the structure shown in FIG. 9. Other device-threshold-tailoring implants may also be created at this time.

Figure 10:
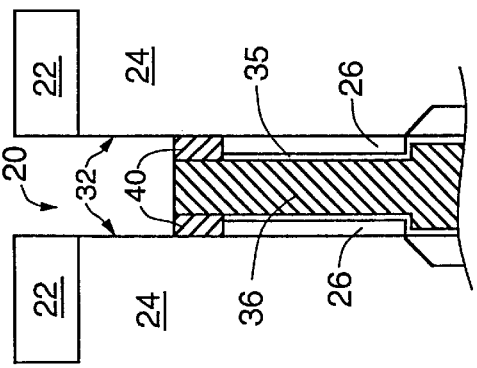

Next, as shown in FIG. 10, sacrificial oxide 44 is removed, such as by a chemical wet etch process with an HF-containing solution. Then, gate oxide 45 is grown and a conductive gate layer 48, such as polysilicon having a thickness approximately equal to the diameter of trench 20, is formed. A nitride pad (not shown) is formed having a thickness of approximately half to approximately equal to the thickness of gate layer 48.

An active area 54 is patterned (see FIGS. 11A and 11B), typically by photolithography, and an etching step, such as RIE, is performed to etch shallow trench isolation (STI) regions 46 everywhere except in active area 54. STI regions 46 are filled, typically with an oxide, and planarized by a CMP step down to the pad nitride. The pad nitride is then stripped away, leaving the structure shown in FIG. 10.

Next, a thin seed layer of polysilicon is typically deposited, extending polysilicon gate layer 48 over the edge of trench 20 and over top diffusion region 62 in p-well 50 of substrate 24. Middle layer 56, which typically comprises a higher conductivity material than polysilicon gate layer 48, such as tungsten (W) or tungsten silicide (WS), is then formed. Finally, gate cap layer 58, comprising SiN or silicon oxide, is formed. The gate conductor layers are then patterned by lithography and dry etched, leaving the gate conductor 59 (comprising gate layer 48, middle layer 56, and gate cap 58) shown in FIG. 12.

Next, side wall isolation spacers 70, typically comprising silicon nitride, silicon oxide, or a combination of those materials, are created by processes well-known in the art to electrically isolate the wordline (gate conductor 59) from the bitline (the diffusion contact 64). Spacers 70 are typically created by depositing a conformal coating of SiN of about 10 nm to about 100 nm, and performing an anisotropic dry spacer etch process to leave the spacers 70 only on the side walls of gate conductor 59. At this time, optional added implants may be performed to tailor source and drain regions (diffusion regions 62 and 62') of the transistor.

Next, the isolating regions between multiple gate conductors 59 on the wafer are typically filled with an interlevel dielectric 63, and contact holes are etched via lithography and dry etching to create the holes in which to form diffusion contact 64. Diffusion contact 64 typically comprises doped polysilicon or a tungsten stud. The overlapping region 72 of diffusion contact 64 and of gate cap layer 58 of gate conductor 59, as shown in FIG. 12, is typical of diffusion contacts known as borderless contacts.

Figure 11A:
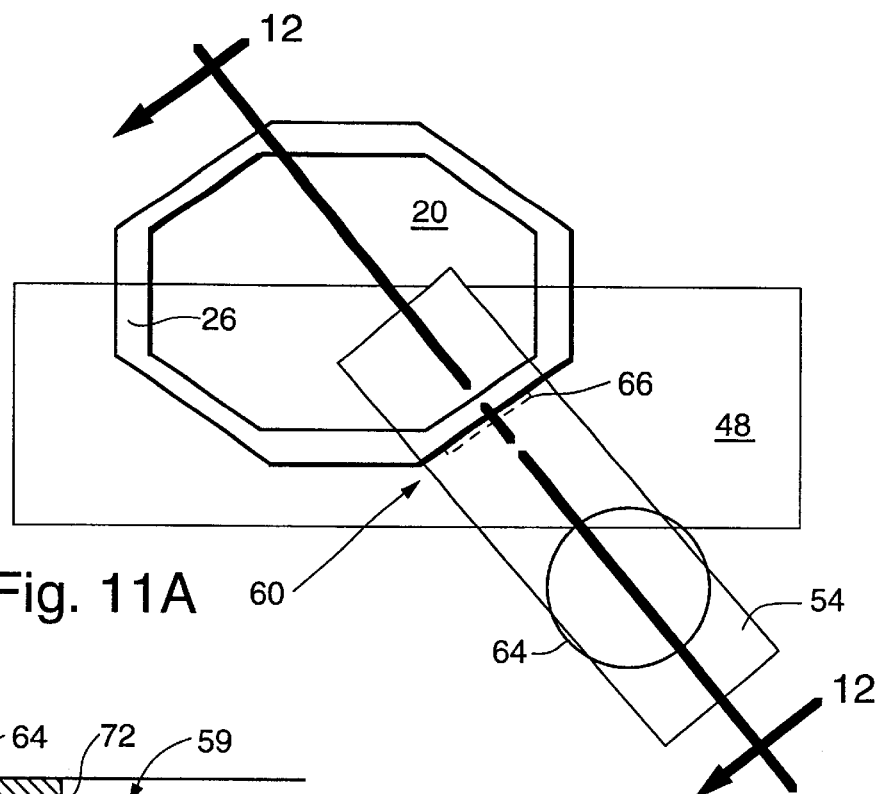
FIG. 11A is a schematic illustration plan view of an exemplary DRAM cell, made according to the present invention, with the device oriented along a crystallographic plane in the same family as the substrate surface.
Figure 12:
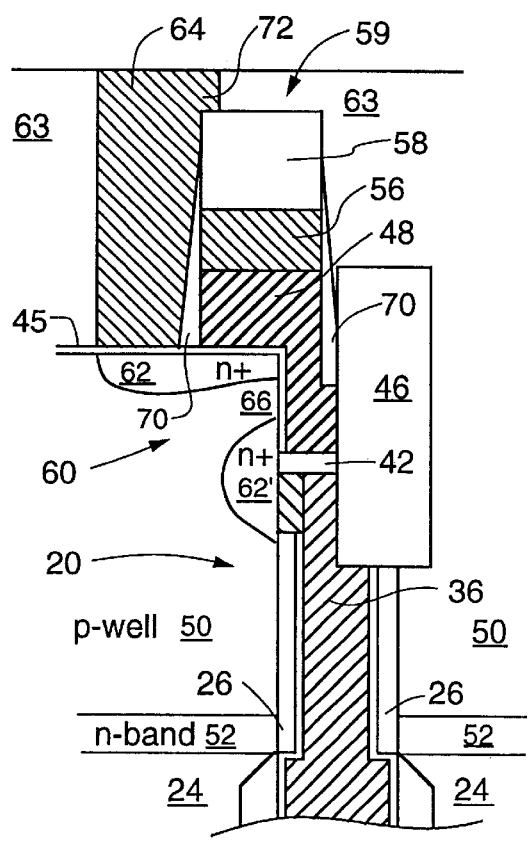
FIG. 12 is a schematic cross-sectional illustration of the DRAM cell of FIG. 11A or FIG. 11B taken along the line 12—12.
Figure 11B:
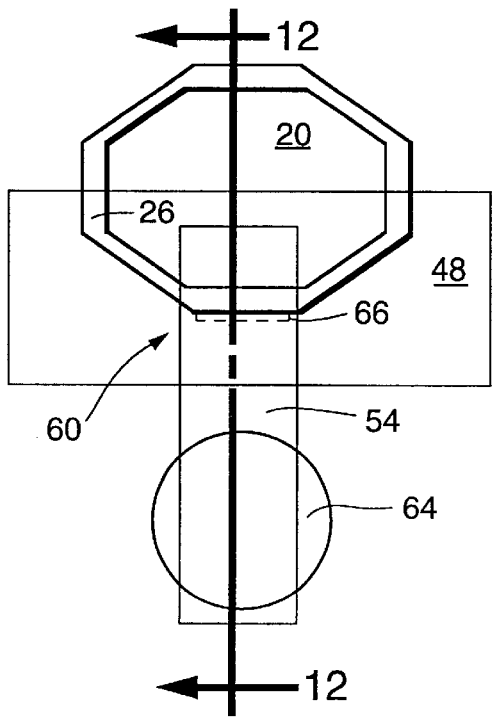
FIG. 11B is a schematic illustration plan view of an exemplary DRAM cell, made according to the present invention, with the device oriented along a different crystallographic plane in a different family from the substrate surface.

Thus, as shown in FIGS. 11A, 11B, and 12, an exemplary trench-side wall array device 60 results from the exemplary process described above. As shown, n+ diffusion regions 62, 62' under diffusion contact 64 adjacent to trench 20 serve as the source and drain of device 60. A channel 66 results in substrate 24 (p-well 50) adjacent faceted side wall 32 of trench 20. Although device 60 as shown in FIG. 11A has been fabricated across the (001) plane, device 60 may also be fabricated across the (011) plane as shown in FIG. 11B. The surface of substrate 24 is typically along the (100) plane. Thus, device 60 may be along a crystallographic plane in the same family as the substrate surface {001}, as shown in FIG. 11A, or may be on a different crystallographic plane (011) in a different family, as shown in FIG. 11B.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed:

1. A dynamic random access memory (DRAM) cell including a deep trench storage capacitor comprising:

a side wall defining a trench and being aligned to a first crystallographic plane having a first crystallographic orientation along a single crystal axis; and an active transistor device partially disposed on the side wall of the trench;

wherein the first crystallographic plane to which the side wall is aligned is (001) silicon or (011) silicon.

2. The DRAM cell of claim 1 wherein the deep trench storage capacitor is located in and on a substrate having a surface extending along a second crystallographic plane, the first crystallographic plane to which the side wall is aligned comprising (011) silicon and the second crystallographic plane to which the substrate is aligned comprising (001) silicon.

3. A dynamic random access memory (DRAM) cell including a deep trench storage capacitor comprising:

a side wall defining a trench and being aligned to a first crystallographic plane having a first crystallographic orientation along a single crystal axis;

an active transistor device partially disposed on the side wall of the trench; and a substrate in and on which the deep trench storage capacitor is located, the substrate having a surface extending along a second crystallographic plane, wherein the first crystallographic plane and the second crystallographic plane are members of a family of equivalent planes.

4. The DRAM cell of claim 3 wherein the family of equivalent planes is {001} silicon.

* * * * *